(12) United States Patent
DeMore et al.

(10) Patent No.: US 6,249,439 B1
(45) Date of Patent: Jun. 19, 2001

(54) MILLIMETER WAVE MULTILAYER ASSEMBLY

(75) Inventors: Walter R. DeMore, La Crescenta; Richard A. Holloway, El Segundo; Bruce A. Holmes, Redondo Beach; Benjamin T. Johnson, Manhattan Beach; Dale A. Londre, Anaheim; Lloyd Y. Nakamura, Redondo Beach, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/422,581

(22) Filed: Oct. 21, 1999

(51) Int. Cl.[7] .................................................. H01Q 23/00
(52) U.S. Cl. ......................... 361/752; 361/753; 361/762; 361/764; 361/780; 361/794; 361/795; 333/246; 333/247; 333/248; 343/700 MS
(58) Field of Search ..................................... 361/752, 753, 361/762, 764, 780, 794, 737, 741, 761, 792, 795, 796, 756; 174/250, 255, 261, 262; 257/664, 728; 333/99 R, 246, 247, 248, 250, 254; 455/327, 328; 343/700 MS, 702

(56) References Cited

U.S. PATENT DOCUMENTS

| | | | |
|---|---|---|---|
| 4,238,798 | * 12/1980 | Aitken et al. ................. 343/700 MS |
| 5,045,820 | * 9/1991 | Leicht et al. .......................... 333/247 |
| 5,119,048 | * 6/1992 | Grunwell .............................. 333/246 |
| 5,138,436 | * 8/1992 | Koepf .................................... 333/247 |
| 5,206,986 | * 5/1993 | Arai et al. ............................. 361/816 |
| 5,219,377 | * 6/1993 | Poradish ............................... 333/247 |
| 5,359,488 | * 10/1994 | Leahy et al. .......................... 361/792 |
| 5,450,046 | * 9/1995 | Kosugi et al. ........................ 333/246 |
| 5,450,090 | * 9/1995 | Gels et al. ..................... 343/700 MS |
| 5,517,747 | * 5/1996 | Pierro et al. .......................... 174/250 |
| 5,644,277 | * 7/1997 | Gulick et al. ......................... 333/246 |
| 5,870,063 | * 2/1999 | Cherrette et al. ............. 343/700 MS |
| 5,872,545 | * 2/1999 | Rammos ....................... 343/700 MS |
| 5,990,836 | * 11/1999 | Bhattacharyya .............. 343/700 MS |

* cited by examiner

Primary Examiner—Jeffrey Gaffin
Assistant Examiner—John B. Vigushin
(74) Attorney, Agent, or Firm—Terje Gudmestad

(57) ABSTRACT

A millimeter wave multilayer phased array assembly has a multilayer board consisting of several laminated printed wiring boards (PWBs) and a frame having a waveguide input and waveguide output. The PWBs are made of a high frequency laminate material and have a pattern of metalization to perform varying electronic tasks. These tasks include electrical interconnection, RF signal transmission, DC current routing and DC signal routing.

18 Claims, 3 Drawing Sheets

MILLIMETER WAVE MULTILAYER ASSEMBLY

STATEMENT OF GOVERNMENT INTEREST

Portions of the invention set forth herein were developed with Government support. As a result, the United States of America as represented by its various departments and agencies may have certain rights in this patent.

TECHNICAL FIELD

The present invention relates to microwave and millimeter wave circuit assemblies, and more particularly, to millimeter wave circuits for satellite communication applications.

BACKGROUND ART

Microwave and millimeter wave multichip assemblies are expensive to design and develop and require substantial labor commitments to manufacture. Prototyping and production lead times are long and yield rates are low. Traditional monolithic microwave integrated circuit (MMIC) assemblies are produced with machined metal housings, generally of aluminum or Kovar material and use alumina, beryllia, aluminum nitride or similar co-fired ceramic substrates. These prior art assemblies are multiple material systems fabricated using many different process steps. These process steps are costly since the assemblies cannot be fabricated in a fully automated operation in large quantities by such processing techniques.

In a traditional MMIC assembly, a fired ceramic substrate is provided for structural integrity. Circuits are then built on the substrate in stacked layers. Each layer starts with "green" state materials and is then processed in the "green" state (screen-printing, via formation, etc.). Each layer is then cured at a slightly elevated temperature (<100° C.) so that the metalization is dried and will stick to the "green" ceramic layers for the duration of processing. Several different layers are produced in this manner as required for the final assembly. The built-up layers are then pressed together so that the materials of adjacent "green" layers contact each other. The assembly is then heated to temperatures ranging from 800° to 1800° C. to sinter the ceramic material.

Besides the complex processes required to produce traditional MMIC assemblies, ceramics have inferior mechanical properties. The disadvantages include susceptibility to cracking and lower reliability. Furthermore, ceramic substrates do not allow large numbers of user channels to be formed from a single antenna aperture. This leads to weight and cost penalties at the spacecraft level.

Thus there is a need for a microwave phased array assembly using conventional (PWB) processes, which includes integrated RF, digital, analog and antenna elements, as well as other possible functions, such as I/O.

SUMMARY OF THE INVENTION

It is, therefore, an object of the invention to provide a less expensive microwave and millimeter wave assembly. Another object of the invention is to produce a microwave and millimeter wave assembly using conventional PWB processes.

In one aspect of the invention, a millimeter wave phased array assembly has a multilayer board consisting of several laminated printed wiring boards (PWBs) and a frame having a waveguide input and output. The PWBs are made of a high frequency laminate material and have a pattern of metalization to perform varying electronic tasks. These tasks include electrical interconnection, RF signal transmission, DC current routing and DC signal routing.

The multilayer board of the present invention is comprised of several components. These components include several adjacent interconnect layers, a lower ground layer, a RF layer, an upper ground layer and several MMIC chips. The interconnect layers provide electrical connection between components and the other layers. The lower ground layer is laminated on top of the interconnect layers and provides electromagnetic shielding. The RF layer is laminated on top of the lower ground layer and provides RF connection between components. The upper ground layer is laminated on top of the RF layer and provides electromagnetic shielding.

The multilayer board also has at least one MMIC chip cavity. The cavity is formed in the top three layers (upper ground, RF and lower ground) and at least one interconnect layer. The cavity is provided in the multilayer board for mounting and connecting a MMIC chip.

The present invention thus achieves a microwave and millimeter wave phased array assembly using conventional PWB processes. This results in lower manufacturing costs as compared to conventional ceramic MMIC processes. The phased array package has the added advantage of allowing a larger number of user channels than traditional assemblies.

Additional advantages and features of the present invention will become apparent from the description that follows, and may be realized by means of the instrumentalities and combinations particularly pointed out in the appended claims, taken in conjunction with the accompanying drawings.

BEST MODES FOR CARRYING OUT THE INVENTION

Figure 1:
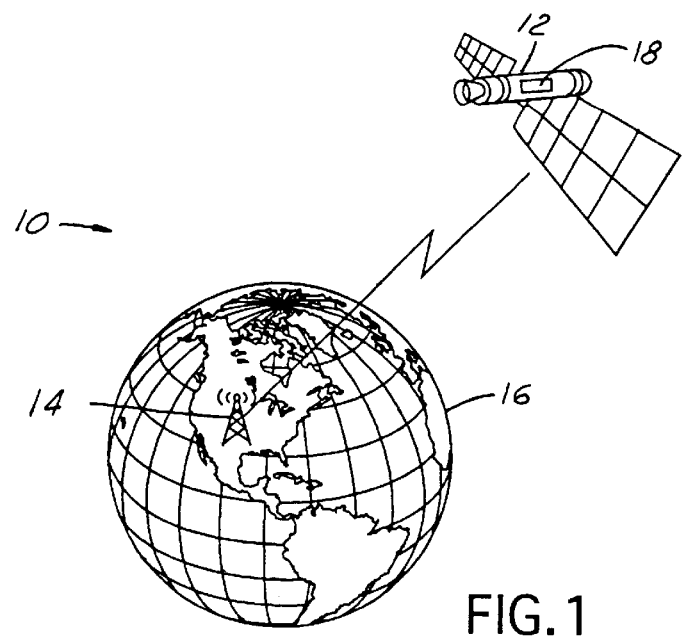
FIG. 1 is a perspective view of a satellite communications system.

Referring to FIG. 1, a satellite communications system 10 according to one embodiment of the present invention is illustrated. The satellite communications system 10 is comprised of a satellite 12 in communication with a ground station 14 located on the Earth 16. The satellite 10 contains a millimeter wave multilayer assembly 18 for a phased array application.

Figure 2:
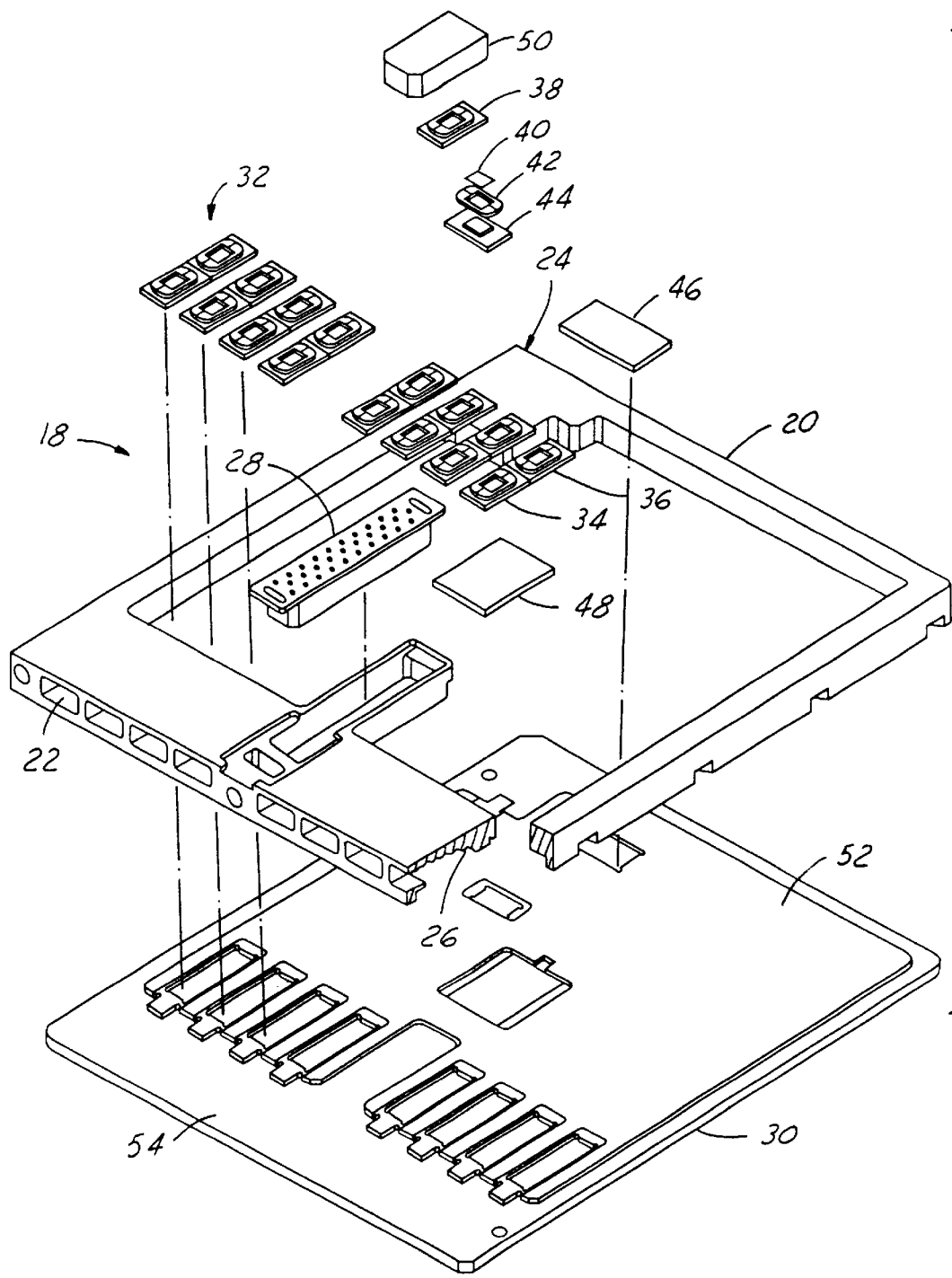
FIG. 2 is an exploded view of a millimeter wave multilayer assembly in accordance with the present invention.

Referring now to FIG. 2, an exploded view of a millimeter wave multilayer assembly 18 in accordance with the present invention is illustrated. In this particular embodiment, a phased array antenna implementation is shown with eight user output channels. Of course, other MMIC applications would readily present themselves to one skilled in the art in light of the following description. Accordingly, this invention is not intended to be limited to the embodiment shown.

Frame 20 is machined from a thermally conductive material, such as aluminum, or an aluminum alloy such as "AlBeMet 162" available from Brush Wellman, Inc., and has waveguide outputs 22 and one waveguide input 24. Each waveguide output 22 and input 24 has a ridge probe 26 that is integral to frame 20. Frame 20 also serves to stiffen the overall assembly and provides modularity for DC connector 28. In the present example, frame 20 has eight waveguide outputs 22.

DC connector 28 is mounted in frame 20 and is electrically connected to multilayer board 30 to provide electrical interconnectivity between adjacent similar modules and an originating source. This particular implementation uses a conventional DC connector 28 with thirty cavities and a wave solder process is used to connect DC connector 28 to conductive pads 60 on multilayer board 30. Preferably, high temperature solder is used, such as Sn96Ag04 or equivalent.

Multilayer board 30 is comprised of four to eight laminated printed wiring boards made of a dielectric material with low loss characteristics for micro and millimeter wavelength electromagnetic radiation. Each printed wiring board is, of course, clad with a conductive metal. One suitable material is 0.008 inch thick Rogers RO4003 high frequency laminate material clad with 0.5 ounce copper. This is a readily available and has acceptable loss characteristics for micro and millimeter wavelength electromagnetic radiation, particularly in the 43.5 to 45.5 GHz ranges. A laminating agent is used to bond the printed wiring boards together to form multilayer board 30. Suitable laminating materials include FEP (a Teflon bonding material available from Dupont), Arlon 6700 bonding film, or other bonding materials common to standard multilayer PWB manufacture.

Multilayer board 30 has eight MMIC assemblies 32 eutectically mounted to coincide with ridge probes 26. Each individual MMIC assembly 32 is comprised of an attenuator 34 and a phase shifter 36. Multilayer board 30 also has two low noise amplifiers (LNA) 38, a LNA DC bias chip 46 and a divider network chip 48. Attenuator 34, phase shifter 36 and low noise amplifier 38 consist of a monolithic microwave integrated circuit chip 40, a slave ring 42 and a pedestal 44 for incorporating each device into the multilayer board 30. Cavity mode suppressors 50 are used to shield each of the above components.

Figure 4:
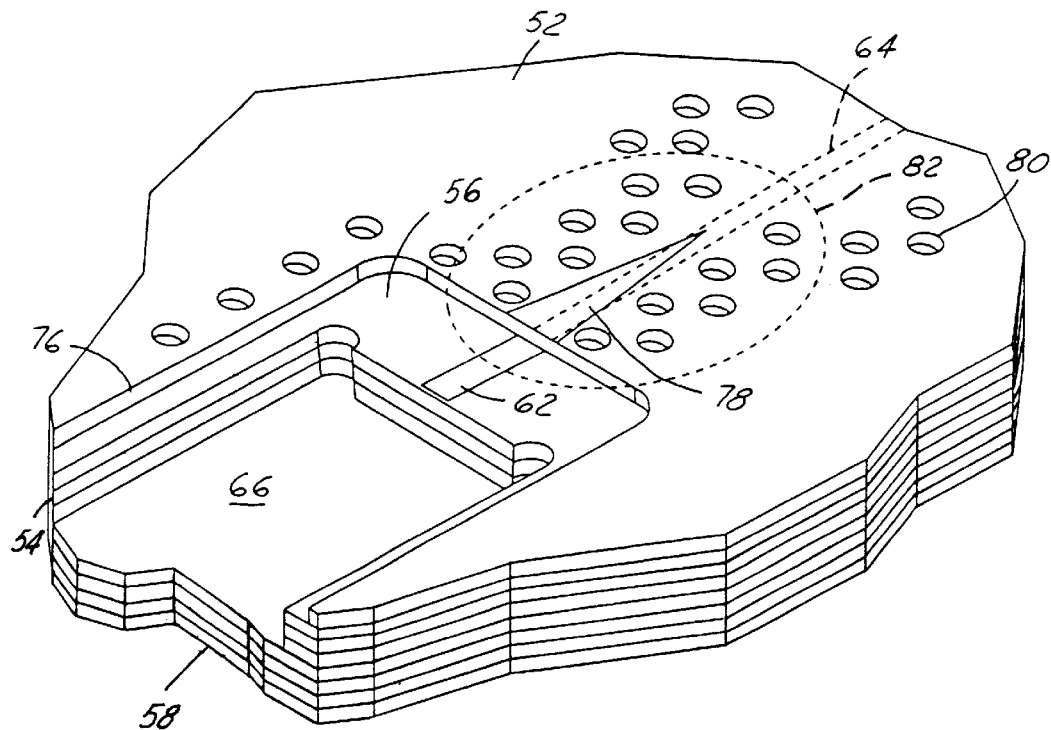
FIG. 4 is an enlarged view of area 4 in FIG. 3.
Figure 3:
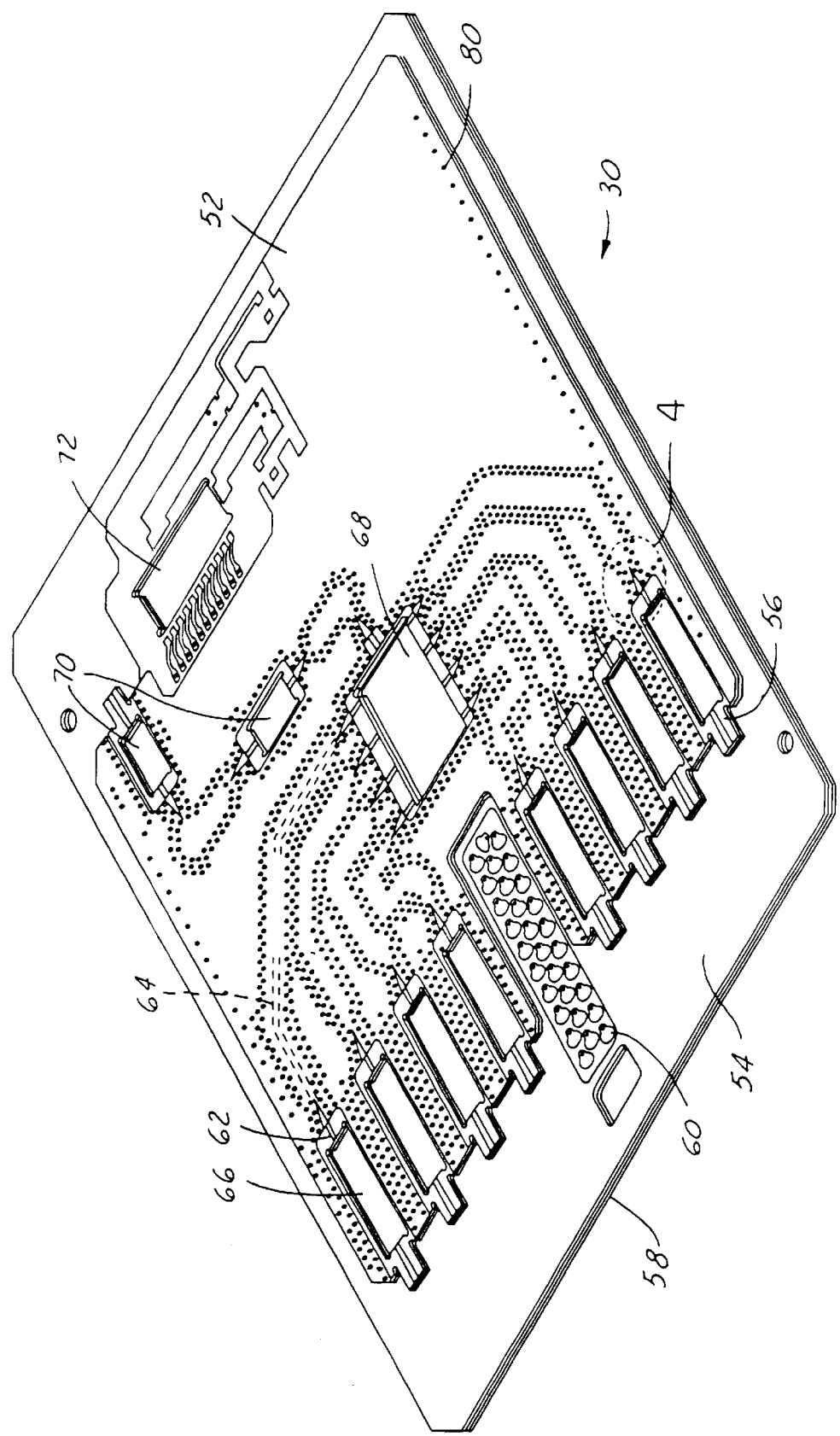
FIG. 3 is a perspective view of a multilayer board in accordance with the present invention.

Referring now to FIG. 3, a perspective view of multilayer board 30 is shown. The layers of multilayer board 30 include an upper ground layer 52, a RF layer 56, a lower ground layer 54 and several interconnect layers 58 (the layers are best shown in FIG. 4). Each layer has a predetermined pattern of metalization and vias 80 to allow interconnection between different layers and other components. Frame 20 is attached to lower ground layer 54 using Sn96Ag04 solder or an equivalent bonding agent and is matched to the thermal expansion characteristics of multilayer board 30.

In order to house and interconnect the various chips, cavities are formed in the top several boards before they are laminated together to form the multilayer board 30. These cavities include eight MMIC assembly cavities 66, a divider cavity 68, two low noise amplifier cavities 70 and a DC bias cavity 72. The cavities formed in the upper ground layer are slightly larger than the cavities formed in the other boards to expose a stripline 64, which forms a microstrip 62.

Referring now to FIG. 4, an enlarged view of area 4 in FIG. 2 is illustrated. Upper ground layer 52 has a triangular area 78 etched away to expose the underlying dielectric material 76 and form a stripline to microstrip RF transition 82. This triangular area 78 is modeled using electronic design tools to function in conjunction with the dielectric material and stripline 64 configuration below it. Microstrip 62 and stripline 64 are continuous on the RF layer 56, are tapered in the area under the triangular area 78 and are surrounded by metalized vias 80. This allows RF transition from stripline to microstrip.

The millimeter wave multilayer assembly 18 described above may be fabricated using standard PWB processes. Four to eight circuit board layers are cut from a sheet of PWB material. The PWB material used has low loss characteristics for millimeter wave signal propagation and metal cladding. Each individual layer is processed in accordance with its ultimate function: interconnect layers 58, lower ground layer 54, RF layer 56 or upper ground layer 52. MMIC assembly cavities 66, a divider network cavity 68, LNA cavity 70, a LNA DC bias cavity 72 and vias 80 are cut in several layers. The cladding on each board is then etched and metalized to form interconnect metalization. The layers are then laminated together using conventional bonding material to form a multilayer board 30.

A frame 20 is machined from a thermally conductive material with a coefficient of thermal expansion similar to the above described multilayer board 30. During the machining process the overall shape of the frame 20 is defined and waveguide outputs 22 and a waveguide input 24 with integral ridge probes 26 are formed. The frame 20 is then bonded to the above multilayer board 30 to add stiffness and provide modularity for future assembly.

Once the frame 20 is bonded to the multilayer board 30, MMIC chip assemblies 32, low noise amplifier chips 38, a LNA DC bias chip 46 and a divider network chip 48 are placed in the previously formed cavities. Each chip is then coupled to the interconnect layers which completes the assembly.

In operation, a millimeter wave signal enters waveguide input 24 of frame 20. An integral ridge probe 26 routes the millimeter wave signal to a pair of low noise amplifiers 38 for amplification. The amplified signal then enters a microstrip 56 and passes to a stripline 64 by way of a microstrip to stripline RF transition 82. Because the material has low loss characteristics for millimeter wave electromagnetic radiation, the signal can propagate with very little loss through RF layer 56 along stripline 64. An upper ground layer 52, a lower ground layer 54 and metalized vias 80 shield the signal. A divider network 48 splits the signal to several MMIC assemblies 32 that phase shift the signal for output from corresponding waveguide outputs 22 for satellite communication.

It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims.

What is claimed is:

1. A millimeter wave multilayer assembly, comprising:
   a multilayer board, comprising:
      a plurality of laminated printed wiring board interconnect layers adjacently disposed, each interconnect layer having a predetermined pattern of interconnect metalization disposed thereon and a plurality of metalized interconnect vias extending therethrough which couple each interconnect metalization of each of said interconnect layers;
      a lower ground layer disposed on the interconnect layers, said lower ground layer having substantially continuous metalization disposed thereon and a plurality of metalized lower ground vias extending therethrough;
      an RF layer disposed on said lower ground layer, said RF layer having a predetermined pattern of microstrip and stripline metalization disposed thereon and a plurality of metalized RF vias extending therethrough;
      an upper ground layer disposed on said RF layer, said upper ground layer having substantially continuous metalization disposed thereon, a plurality of metalized upper ground vias extending therethrough and a stripline to microstrip RF transition area;
      a cavity defined in said upper ground layer, RF layer, lower ground layer and at least one top layer of said interconnect layers; and
      a microwave and millimeter wave integrated circuit (MMIC) chip disposed in said cavity and connected to said interconnect metalization and said microstrip; and a frame coupled to said multilayer board, said frame having a waveguide input and a waveguide output, said waveguide input and waveguide output having a ridge probe positioned above said microstrip.

2. A millimeter wave multilayer assembly as recited in claim 1 wherein said upper ground layer, RF layer, lower ground layer and interconnect layers have low loss characteristics for micro and millimeter wavelength electromagnetic radiation.

3. A millimeter wave multilayer assembly as recited in claim 1 wherein said upper ground layer, RF layer, lower ground layer and interconnect layers have low loss characteristics for 43.5 to 45.5 GHz electromagnetic radiation.

4. A millimeter wave multilayer assembly as recited in claim 1 wherein said upper ground layer, RF layer, lower ground layer and interconnect layers comprise Rogers RO4003.

5. A millimeter wave multilayer assembly as recited in claim 1 wherein said metalization is comprised of copper.

6. A millimeter wave multilayer assembly as recited in claim 1 wherein each layer is bonded together.

7. A millimeter wave multilayer assembly as recited in claim 1 further comprising selected passive components disposed within said interconnect layers.

8. A millimeter wave multilayer assembly as recited in claim 1 further comprising passive components disposed on said upper ground layer.

9. A millimeter wave multilayer assembly as recited in claim 1 wherein said frame is bonded to said multilayer board.

10. A millimeter wave multilayer assembly as recited in claim 1 wherein said ridge probe is integral to said frame.

11. A millimeter wave multilayer assembly as recited in claim 1 wherein said frame is thermally conductive and has a coefficient of thermal expansion substantially similar to a coefficient of thermal expansion of said multilayer board.

12. A millimeter wave multilayer assembly as recited in claim 1 further comprising:
at least three MMIC assemblies, each MMIC assembly having an attenuator coupled to a phase shifter coupled to a slave ring, each of said MMIC assemblies being disposed in corresponding adjacent MMIC assembly cavities defined in said upper ground layer, RF layer, lower ground layer at least one top layer of said interconnect layers and coupled to the interconnect metalization and microstrips.

13. A millimeter wave multilayer assembly as recited in claim 12 further comprising:
at least three waveguide outputs, each of said waveguide outputs coupled to a respective one of said MMIC assemblies through said microstrips.

14. A millimeter wave multilayer assembly as recited in claim 12 further comprising:
a divider network disposed in a divider cavity defined in said upper ground layer, RF layer, lower ground layer and at least one top layer of said interconnect layers and coupled to the interconnect metalization and MMIC assemblies.

15. A millimeter wave multilayer assembly as recited in claim 12 further comprising:
at least two low noise amplifiers (LNA), each of said low noise amplifiers disposed in separate LNA cavities defined in said upper ground layer, RF layer, lower ground layer and at least one top layer of said interconnect layers, said LNA coupled to the interconnect metalization and divider network; and
a low noise amplifier bias network disposed in a LNA bias cavity defined in said upper ground layer, RF layer, lower ground layer and at least one top layer of said interconnect layers, said low noise amplifier bias network coupled to the interconnect metalization.

16. A millimeter wave multilayer assembly as recited in claim 12 wherein said MMIC assemblies are mounted on a pedestal disposed in said MMIC assembly cavities.

17. A millimeter wave multilayer assembly as recited in claim 1 further comprising:
a DC connector coupled to said interconnect layer metalization whereby adjacent devices and an originating source are coupled to said millimeter wave multilayer assembly.

18. A satellite communications system comprising:
a ground station;
at least one satellite in communication with said ground station; and
a millimeter wave multilayer assembly positioned in said satellite and having a multilayer board and a frame, said multilayer board comprising:
a plurality of laminated printed wiring board interconnect layers adjacently disposed, each interconnect layer having a predetermined pattern of interconnect metalization disposed thereon and a plurality of metalized interconnect vias extending therethrough which couple each interconnect metalization of each of said interconnect layers;
a lower ground layer disposed on the interconnect layers, said lower ground layer having substantially continuous metalization disposed thereon and a plurality of metalized lower ground vias extending therethrough;
an RF layer disposed on said lower ground layer, said RF layer having a predetermined pattern of microstrip and stripline metalization disposed thereon and a plurality of metalized RF vias extending therethrough;
an upper ground layer disposed on said RF layer, said upper ground layer having substantially continuous metalization disposed thereon, a plurality of metalized upper ground vias extending therethrough and a stripline to microstrip RF transition area;
a cavity defined in said upper ground layer, RF layer, lower ground layer and at least one top layer of said interconnect layers; and
a microwave and millimeter wave integrated circuit (MMIC) chip disposed in said cavity and connected to said interconnect metalization and said microstrip; and
said frame coupled to said multilayer board, said frame having a waveguide input and a waveguide output, said waveguide input and waveguide output having a ridge probe positioned above said microstrip.

* * * * *